(12) United States Patent
Serizawa et al.

(10) Patent No.: US 6,513,959 B2
(45) Date of Patent: Feb. 4, 2003

(54) VEHICLE CEILING-MOUNTING ELECTRIC EQUIPMENT ASSEMBLY

(75) Inventors: Yasuyoshi Serizawa, Shizuoka (JP); Atsuyoshi Yamagushi, Shizuoka (JP); Keizo Nishitani, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 38 days.

(21) Appl. No.: 09/734,687

(22) Filed: Dec. 13, 2000

(65) Prior Publication Data

US 2001/0005083 A1 Jun. 28, 2001

(30) Foreign Application Priority Data

Dec. 13, 1999 (JP) ............................................. 11-353384

(51) Int. Cl.⁷ ................................................ B60Q 3/00
(52) U.S. Cl. ........................ 362/490; 296/214; 362/546
(58) Field of Search .............................. 296/37.7, 37.8, 296/214; 362/459, 490, 488, 493, 546 548, 549

(56) References Cited

U.S. PATENT DOCUMENTS

| 4,054,353 A | | 10/1977 | Saunders et al. | |
|---|---|---|---|---|
| 4,241,870 A | * | 12/1980 | Marcus ....................... | 296/37.7 |
| 4,818,010 A | * | 4/1989 | Dillon ........................ | 296/37.7 |
| 5,239,449 A | * | 8/1993 | Wnuk et al. ........... | 296/37.8 X |
| 5,357,408 A | * | 10/1994 | Lecznar et al. ............... | 362/74 |
| 5,526,241 A | * | 6/1996 | Ferrell ......................... | 362/74 |
| 5,697,693 A | * | 12/1997 | Wittkopp, Jr. et al. ........ | 362/74 |
| 5,944,414 A | * | 8/1999 | Nishitani et al. ........... | 362/490 |

FOREIGN PATENT DOCUMENTS

| DE | 692 19 189 T2 | 1/1992 | |
|---|---|---|---|
| DE | 196 21 148 A1 | 5/1996 | |
| GB | 2 332 043 A | 6/1999 | |
| JP | 2-124344 | 5/1990 | ........... B60R/16/02 |

OTHER PUBLICATIONS

Patent Abstracts of Japan; Publication No. 11204909 A; Jul. 30, 1999; Aoki Nobuaki, et al.

* cited by examiner

Primary Examiner—Joseph D. Pape
(74) Attorney, Agent, or Firm—Sughrue Mion, PLLC

(57) ABSTRACT

In a vehicle ceiling-mounting electric equipment assembly of the invention, an FPC (12) is welded by heat to a casing (11) of a lamp unit (2), and an FFC (16) for external connection is electrically connected to the FPC (12) by press-clamping or welding. Switches (13) and lamp socket holes (14a) are provided at the FPC (12). An end portion of the FPC (12) is folded to be inserted into a fitting portion (11a) of a recess-shape in which an optional member (26) can be mounted, and a circuit pattern is exposed to a side surface of the fitting portion (11a) to form a connection portion. Therefore, the compact, lightweight design can be achieved, and parts, such as a connector, are unnecessary, thus reducing the number of the component parts.

7 Claims, 7 Drawing Sheets

VEHICLE CEILING-MOUNTING ELECTRIC EQUIPMENT ASSEMBLY

BACKGROUND OF THE INVENTION

1. Technical Field

The invention relates to a vehicle ceiling-mounting electric equipment assembly for mounting on a ceiling of a vehicle room of various kinds of vehicles, and more particularly to an assembly structure in which the efficiency of an assembling operation is enhanced, and the number of component parts can be reduced.

2. Related Art

Interior vehicle lamps, such as a room lamp and a spot lamp, have heretofore been mounted on a ceiling of a vehicle. One example of structures of wiring to such interior vehicle lamps by a roof wire harness is shown in Japanese Patent Publication No. Hei. 2-124344A.

As shown in FIGS. 7 to 10, a groove 52 is formed in a peripheral surface of each of a spot light unit 50 and a room lamp unit 51, and a clamp 53 for retaining the unit on a vehicle body is formed on and projects from an upper surface of each of the units. Similarly, clamps 53 are formed on and project from a switch unit 54 on which operation switches of the units 50 and 51 are provided in a concentrated manner.

A flat wire harness 56 includes a plurality of circuit members 57 fixed together in an insulated manner into a flat plate-shape by an insulating sheet 58. The circuit members 57 forms input-output wiring patterns for the units 50, 51 and 54. The circuit member 57 is formed by covering and fixing flattened conductors by the insulating film 58, or by coating an electrically-conductive paste.

As shown in FIG. 10, as the flat wire harness, there can be used a flat cable 56a which is formed by molding a plurality of insulating sheathed wires 57a into a flat plate-shape.

As shown in FIG. 9, mounting holes 60 for the units 50 and 51 are formed through a formed ceiling 59 adapted to be mounted on a ceiling portion of the automobile. A fitting projection 61 for engagement in the groove 52 is formed on an inner peripheral edge of the mounting hole 60.

Similarly to the units 50 and 51, a connector 62 for connecting the flat wire harness 56 to a body harness (not shown) has a clamp 53.

In the roof wire harness W, the connector 62 is connected to a trunk line portion 56A of the flat wire harness 56. The units 50 and 51 are connected respectively to branch line portions 56B. The switch unit 54 is connected to a pillar mounting portion 56C of the trunk line portion. With this arrangement, the circuit members 57 are integrally connected to the units 50, 51 and 54.

FIG. 10 shows the connection structure in which the flat cable 56a is used instead of the flat wire harness 56. More specifically, press-connecting terminals 69 for electrical connection to circuit members are beforehand fixed to the switch unit 54 by press-fitting, a unit cover 55, having clamps 72 for retaining this cover on the switch unit 54, as well as wire-pressing projections 71, is pressed against the switch unit 54 to be attached thereto, so that the insulating sheathed wires 57a are press-fitted respectively into slots 70 of the press-connecting terminals 69, and therefore are connected thereto, respectively.

Therefore, the installation and fixing of the roof wire harness W can be effected by inserting each clamp 53 into a hole 73 in the vehicle body R, as shown in FIG. 9. Then, the formed ceiling 59 is arranged such that the mounting hole 60 in this formed ceiling is disposed in registry with the unit 50, and in this condition the formed ceiling 59 is pushed in a direction of arrows to be set in position. As a result, the formed ceiling 59 is provisionally fixed through the engagement of the fitting projection 61 in the groove 52. In this condition, an outer peripheral portion of the formed ceiling 59 is fixedly held between a garnish (not shown) and the vehicle body R.

Alternatively, the units 50 and 51 can be beforehand fixedly fitted respectively in the mounting holes 60 in the formed ceiling 59, as shown in FIG. 8. In this case, it is only necessary to mount the formed ceiling 59, having the roof wire harness-W installed thereon, on the vehicle body R, and the provision of the clamp 53 on each unit 50, 51 can be omitted.

In the above related roof wire harness, although the number of the exterior parts, such as tapes and tubes, covering the wire harness, can be reduced, it is difficult to reduce the number of component parts including a printed circuit board (PCB), a connector and a lamp lead wire circuit in the lamp unit.

Namely, the printed circuit board and the wire harness are separate from each other, and a connector and so on are required for connecting the two together. In addition, the wiring for the lamp need to be installed separately. Therefore, because of these, the number of the component parts increases, and also the time and labor, required for the operation, increase.

And besides, in the wire harness and the wires, integrally mounted on the formed ceiling, it is necessary to apply a flattening processing such as adhesive bonding and molding, and this increases the cost.

SUMMARY OF THE INVENTION

This invention has been made in view of the above problems, and an object of the invention is to provide a vehicle ceiling-mounting electric equipment assembly in which the number of component parts, as well as the time and labor for the operation, can be reduced, and besides a compact, lightweight design can be achieved.

The above problems have been solved by a vehicle ceiling-mounting electric equipment assembly including:

- a casing fixed to a vehicle ceiling and including a lamp unit provided with a interior lamp;
- a flexible printed circuit fixed to the casing and provided with a switch for controlling a lighting of the interior lamp;
- a flexible flat cable for external connection electrically connected to one end of the flexible printed circuit;
- an over head console retained on the casing and provided with a operation switch witch operates the switch.

In the vehicle ceiling-mounting electric equipment assembly, preferably, bosses, formed on the casing, are passed respectively through boss passage holes formed in the flexible printed circuit, and the flexible printed circuit is welded to the casing by heating the bosses.

Therefore, any screw or the like is not necessary for fixing the flexible printed circuit, and the whole of the vehicle ceiling-mounting electric equipment assembly can be formed into a thin design.

In the vehicle ceiling-mounting electric equipment assembly, preferably, an end portion of the flexible printed circuit is folded to be inserted into a fitting portion of a recess-shape formed on the casing, and a circuit pattern of the flexible printed circuit is exposed to a side surface of the fitting portion to form a connection portion for electrical connection to a member (e.g. an interior vehicle lamp or an optional member) fitted into the fitting portion.

Therefore, part of the circuit pattern is used as the connection terminal for electrical connection to the interior vehicle lamp or other member, and parts, such as a printed circuit board and a connector, are unnecessary, and also lamp lead wires are unnecessary, and therefore the time and labor, required for wiring, can be saved.

In the vehicle ceiling-mounting electric equipment assembly, preferably, the flexible printed circuit and the flexible flat cable are connected together by press-claming or welding.

Therefore, the compact, lightweight design of the vehicle ceiling-mounting electric equipment assembly can be achieved, and the transfer in the production process is easy, and the assembly can be handled easily when it is distributed as a product.

DETAILED DESCRIPTION OF PREFERRED EMBODIMENT

Figure 1:
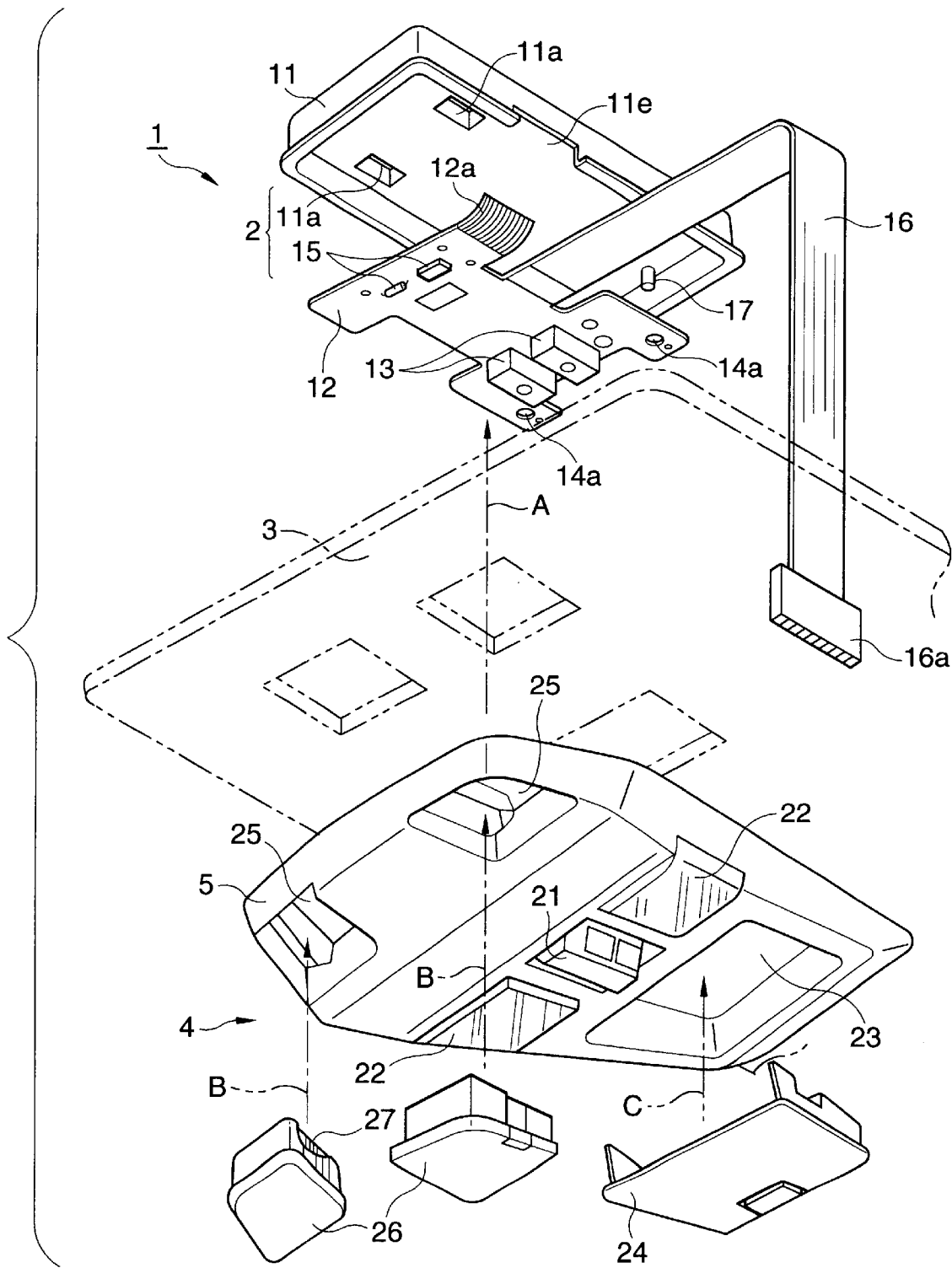
FIG. 1 is an exploded, perspective view showing the construction of a vehicle ceiling-mounting electric equipment assembly of the invention.
Figure 2:
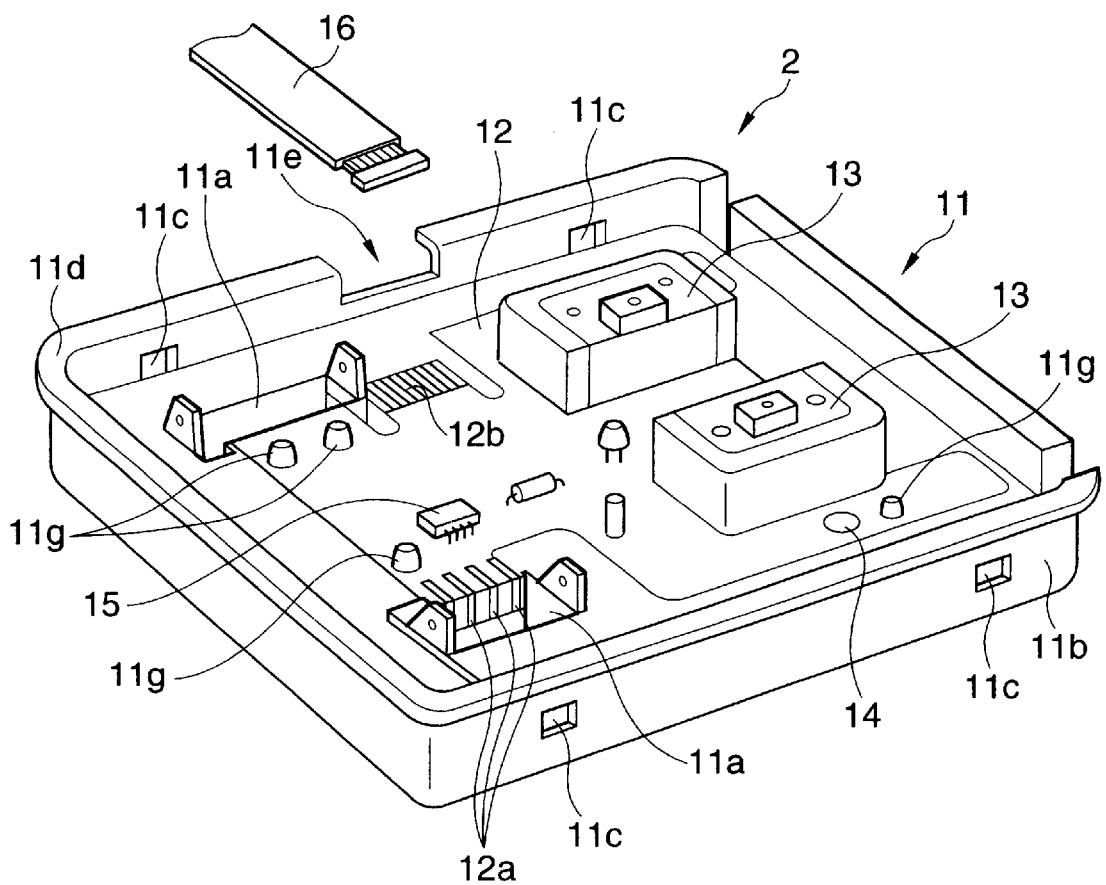
FIG. 2 is a perspective view showing an internal structure of a lamp unit of FIG. 1.
Figure 3:
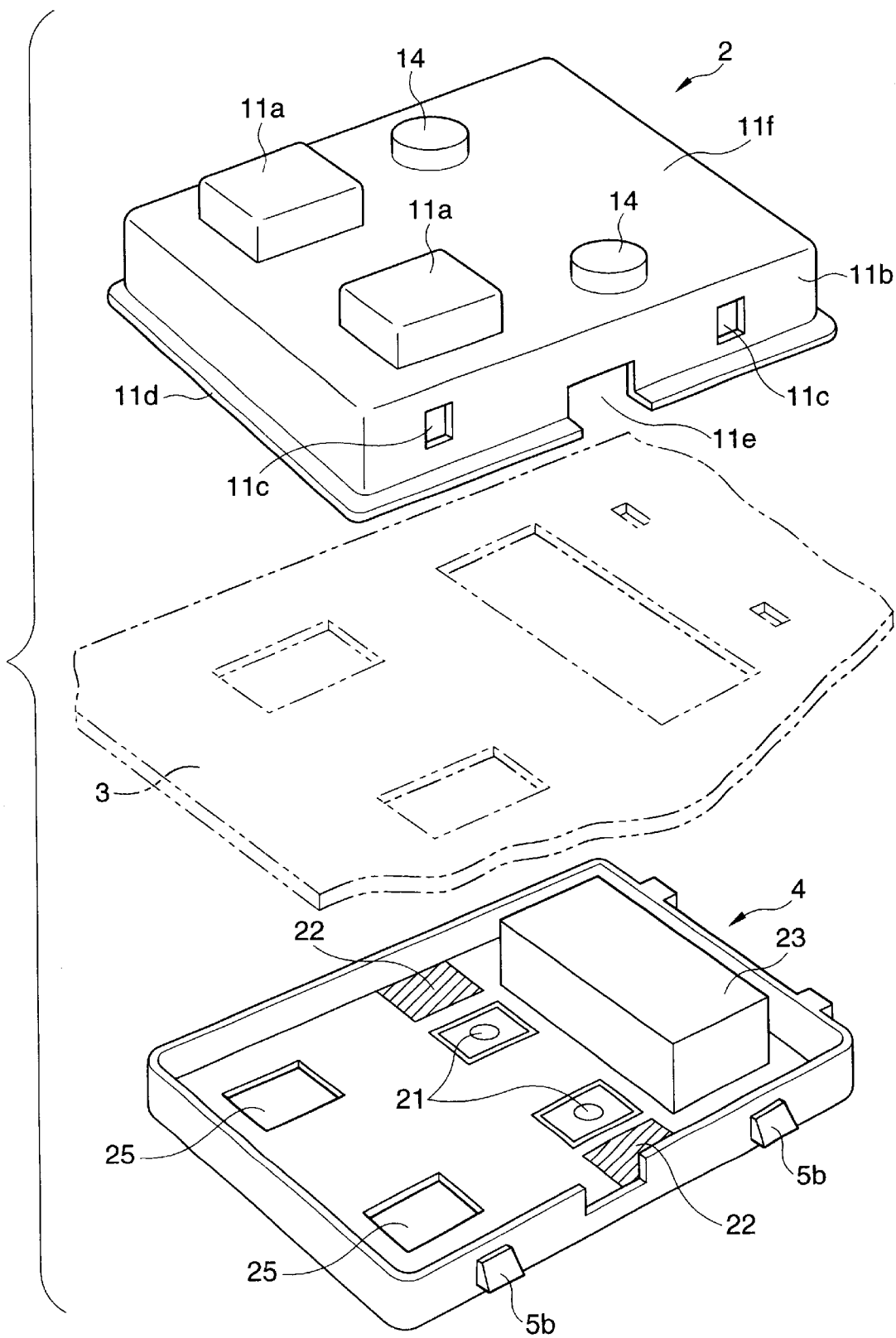
FIG. 3 is an exploded, perspective view showing the mounting of the lamp unit and an overhead console of FIG. 1 relative to each other.
Figure 4:
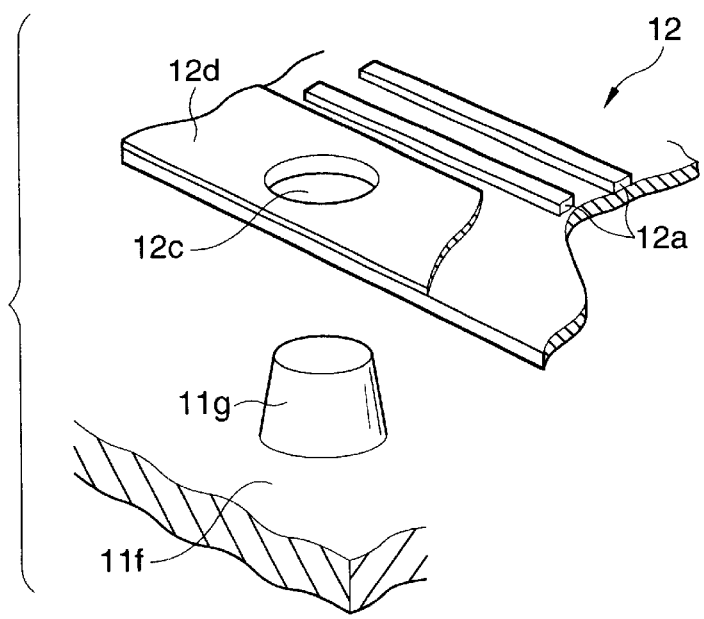
FIG. 4 is a perspectives view of an important portion, showing a retaining structure of a flexible printed circuit of FIG. 1.
Figure 5:
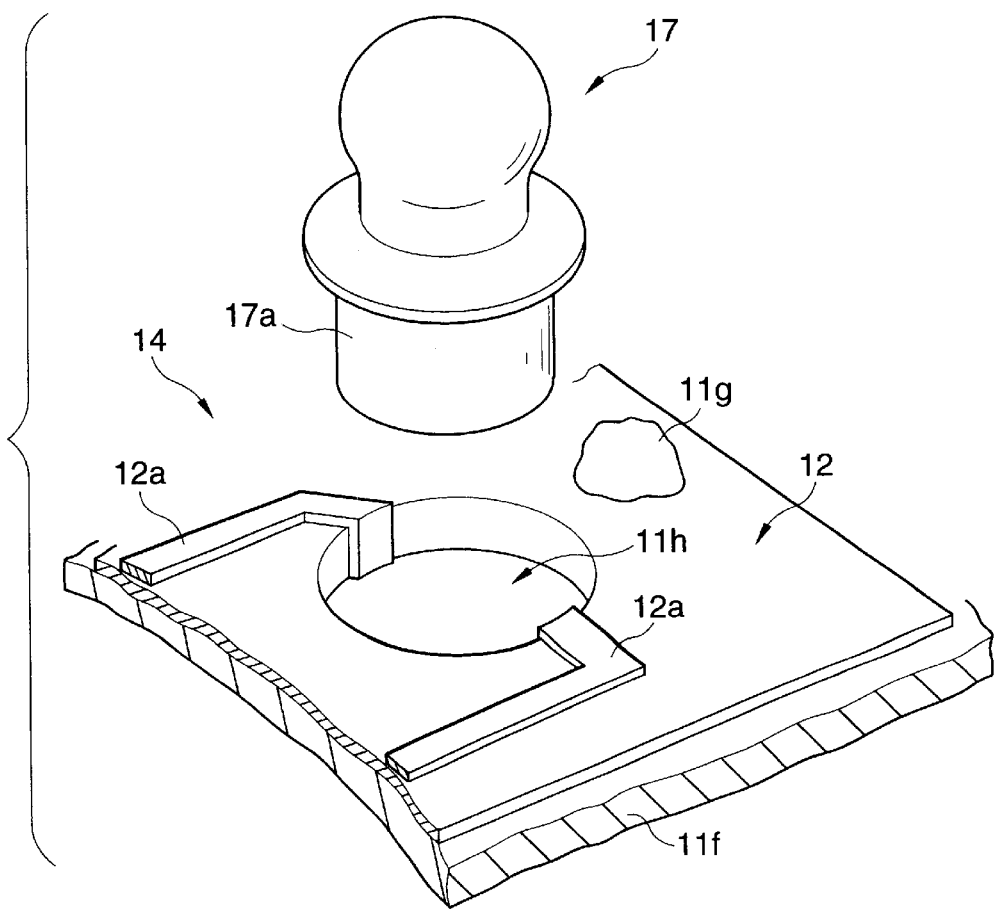
FIG. 5 is a perspective view of an important portion, showing the construction of a lamp socket portion of FIG. 1.
Figure 6:
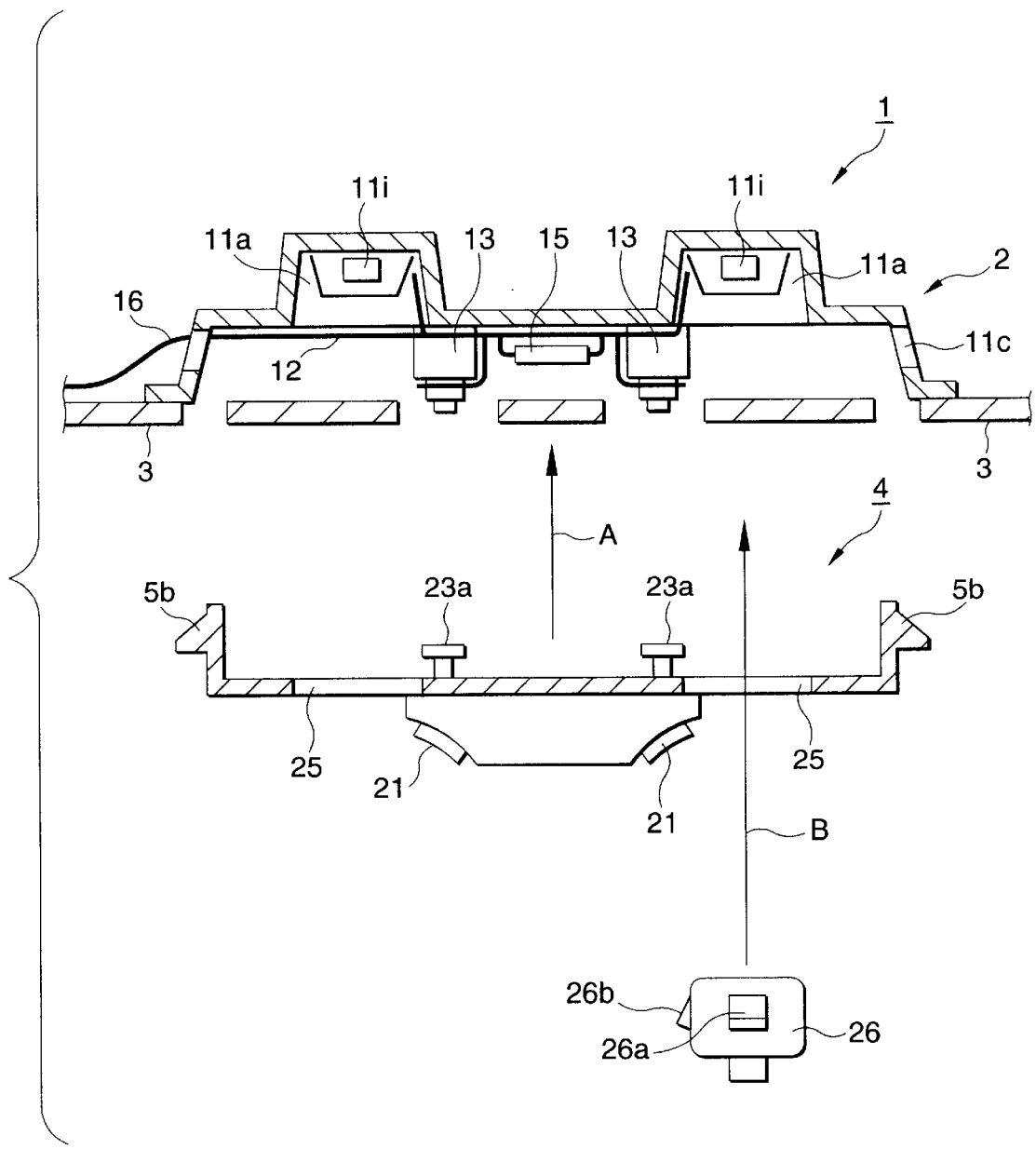
FIG. 6 is a cross-sectional view showing the construction of the vehicle ceiling-mounting electric equipment assembly of FIG. 1.
Figure 7:
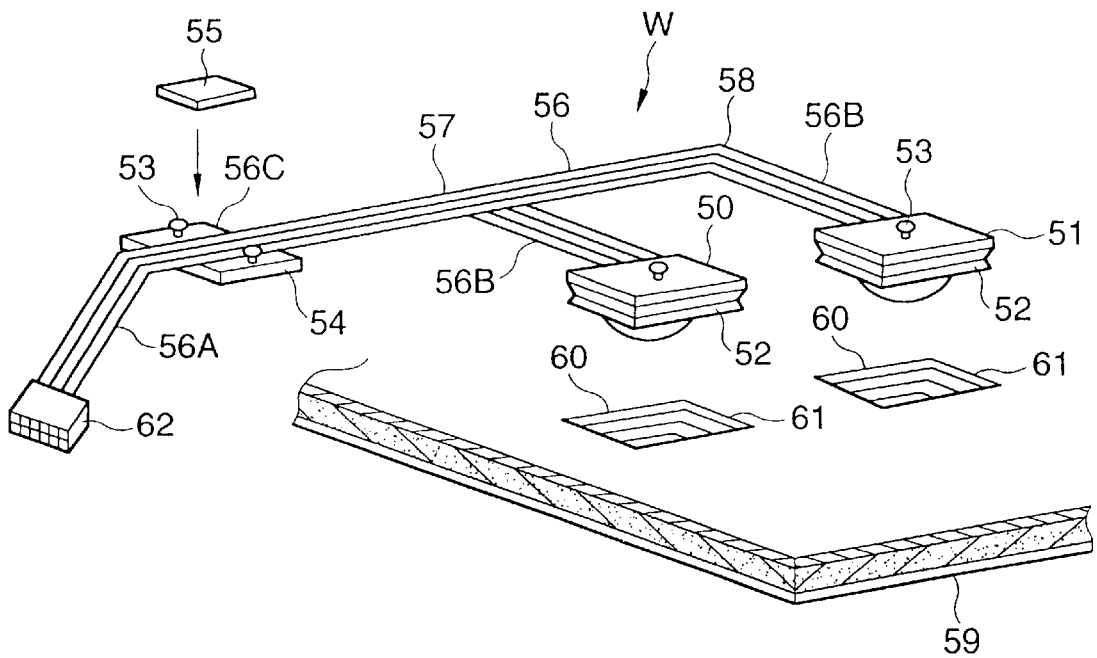
FIG. 7 is a perspective view showing one example of a related roof wire harness.
Figure 8:
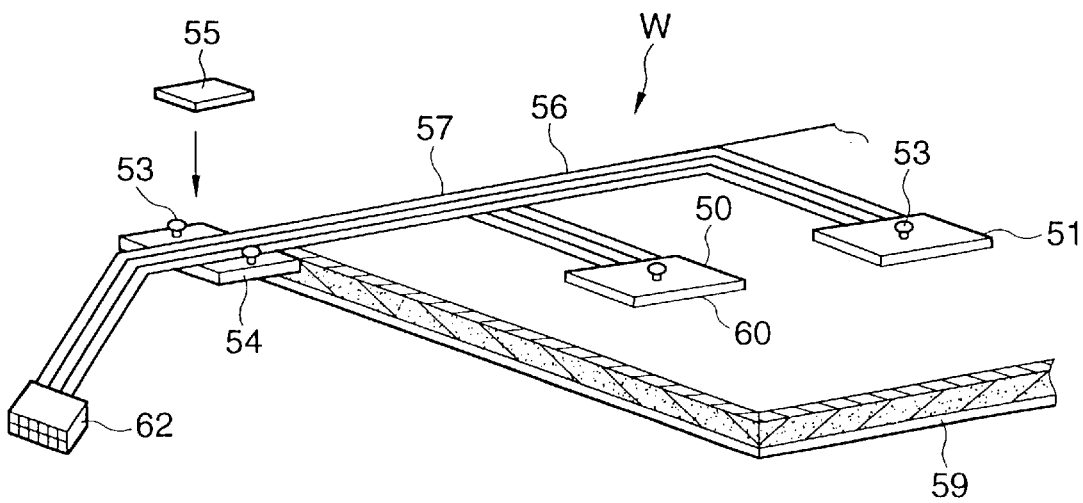
FIG. 8 is a perspective view showing the roof wire harness of FIG. 7 in its installed condition.
Figure 9:
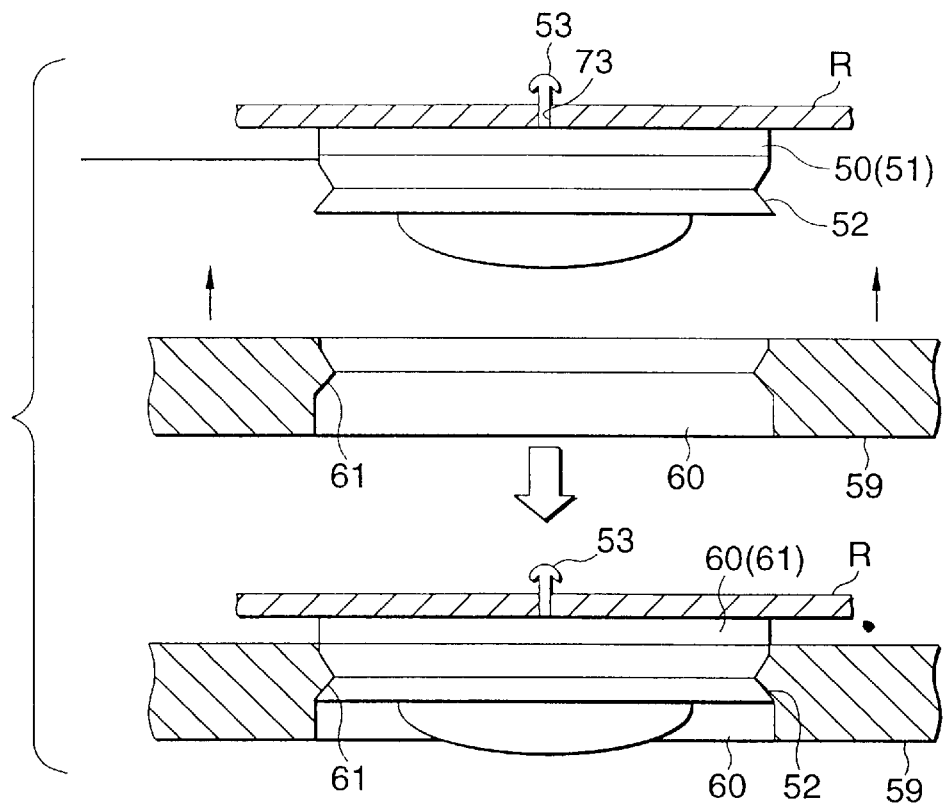
FIG. 9 is a view explanatory of a mounting condition in FIG. 7.
Figure 10:
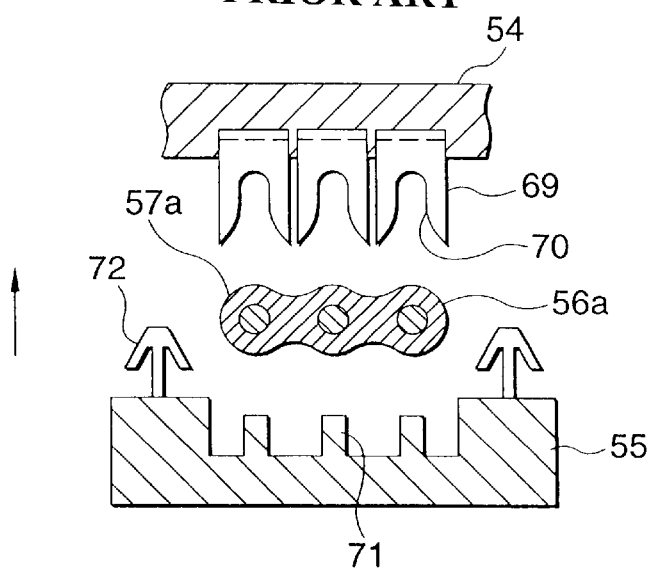
FIG. 10 is a view explanatory of a structure of connecting a switch unit to a circuit member in FIG. 7.

One preferred embodiment of a vehicle ceiling-mounting electric equipment assembly of the invention will now be described in detail with reference to FIGS. 1 to 6. FIG. 1 is an exploded, perspective view showing the construction of the vehicle ceiling-mounting electric equipment assembly. FIG. 2 is a perspective view showing an internal structure of a lamp unit. FIG. 3 is an exploded, perspective view showing the mounting of the lamp unit and an overhead console relative to each other. FIG. 4 is a perspectives view of an important portion, showing a retaining structure of a flexible printed circuit. FIG. 5 is a perspective view of an important portion, showing the construction of a lamp socket portion. FIG. 6 is a cross-sectional view showing the construction of the vehicle ceiling-mounting electric equipment assembly.

In the description of the embodiment, the overall construction will be first described with reference to FIG. 1, and then the constructions and operations of the various members will be described with reference to infra FIG. 2.

As shown in FIG. 1, the vehicle ceiling-mounting electric equipment assembly (hereinafter referred to merely as "assembly") 1 includes the lamp unit 2 shown at an upper portion of this Figure, and the overhead console 4 to be mounted on the lamp unit 2, with a top ceiling 3 (mounted on a ceiling of a vehicle for decorative purposes) interposed therebetween.

The lamp unit 2 includes a casing 11 in which the flexible printed circuit (hereinafter referred to as "FPC") 12 is mounted. Switches 13, lamp socket holes 14a and so on are provided at the FPC 12, and these will be described later in detail with reference to infra FIG. 2. Various electronic parts 15, including resistors and capacitors, are mounted on the FPC 12. A flexible flat cable (hereinafter referred to merely as "FFC") 16 is electrically connected to the FPC 12. The FFC 16 is connected, for example, to a junction box (J/B) which is not shown.

The overhead console 4 has functions as a lid for the lamp unit 2 and also as an operating portion. The overhead console 4 is attached to the lamp unit 2 from the lower side thereof as indicated by arrow A in the drawings. An operating button 21 for operating the switches 13 of the lamp unit 2 is attached to the overhead console 4. Window portions 22, each for transmitting light of a lamp 17 mounted in the lamp socket portion 14 (see FIG. 2), therethrough to provide a room lamp, is provided on the lower side of the overhead console 4.

The overhead console 4 is provided with a sun glass case 23. A cover 24 is releasably attached to this case 23.

Mounting holes 25 for forming a sensor integration as an option-support function are formed in the overhead console 4. A connection portion 27 is formed on a side surface of an optional member 26. The connection portion 27 is connected to a copper foil portion (circuit pattern 12a of the FPC 12) which serves as connection terminals when the optional member 26 is mounted in the mounting hole 25.

The sun glass case 23 and the mounting holes 25 are provided in accordance with the optional requirements by the user, and there are cases where these are not provided. The switch 13, the lamp socket portion 14, the lamp 17 are not particularly limited in construction.

The assemblage of the assembly 1 will be described. As shown in FIG. 1, the FPC 12 is fixed to the casing 11 of the lamp unit 2. At this time, that portion of the circuit pattern 12a (serving as a connection portion), formed at an end of the FPC 12, is inserted into each fitting-portion 11a, formed on the casing 11, in contiguous relation to a side surface of the fitting portion 11a (see FIG. 2). When the assembling operation is completed, each fitting portion 11a communicates with the corresponding mounting hole 25, and the optional member 26 is inserted into the fitting portion 11a through the mounting hole 25. The connection portion 27 of the optional member 26 contacts the circuit pattern 12a, and therefore is electrically connected thereto. The lamp 17 is inserted into the lamp socket portion 14.

Therefore, the lamp unit 2 in an mounted condition is fixedly secured to a ceiling plate (not shown), with the FPC 12 facing downwardly, that is, with the open side of the casing 11 directed downwardly. The FFC 16 is bonded and fixed to the top sealing 3 through a reinforcing plate or the like, and a connector 16a provided at a distal end of the FFC 16 is connected to a joint box (not shown) or the like.

As indicated by arrow A, the overhead console 4 is pushed from a lower position where the overhead console 4 is disposed in opposed relation to the lamp unit 2, so that the overhead console 4 is fitted into the lamp unit 2. Although not shown in FIG. 1, retaining claws are formed on the inner side of the overhead console 4 while retaining holes for respectively retaining these retaining claws are formed in the casing 11. Therefore, the retaining claws are elastically engaged in the retaining holes, respectively, so that the lamp unit 2 and the overhead console 4 are integrally connected together, thus completing the assemblage of the assembly 1.

In the thus assembled assembly 1, the operating button 21 is disposed in opposed relation to the switches 13, and the lamps 17 are disposed in opposed relation to the window portions 22, respectively. The mounting holes 25 communicate with the fitting portions 11a, respectively. When the optional members 26 are inserted respectively into the mounting holes 25 as indicated by arrow B, the attachment of each optional member 26, as well as the connection of the optional member 26 to the circuit pattern 12a (defining the one end portion of the FPC 12), is effected.

The cover 24 is attached to the sun glass case 23 as indicated by arrow C, thereby forming an article-storing case.

The constructions and operations of the various members, constituting the assembly 1, will be described.

As shown in FIG. 2, in the lamp unit 2, the FPC 12 is fixedly mounted in the casing 11, and the various electronic parts 15 are mounted on the circuit pattern of a copper foil formed on the FPC 12. The two switches 13 are provided, and the lamp socket portions 14 (only one of which is shown in the drawings) are provided adjacent to the outside of the switches 13, respectively. The two fitting portions 11a are formed on the casing 11, and the one end portion of the FPC 12 is folded to be inserted into the fitting portion 11a in contiguous relation to the side surface of each of the fitting portions 11a.

The folded portion of the FPC 12 is so folded that the circuit pattern 12a is exposed to the side surface of the fitting portion 11a, and this circuit pattern 12a forms the connection portion to which the optional member 26 can be electrically connected. The FPC 12 is folded similarly with respect to the lamp socket portions 14, and this folding structure and the fixing of the FPC 12 to the casing 11 will hereafter be described in detail with reference to FIGS. 4 and 5.

The casing 11 is formed into a box-shape, and retaining holes 11c are formed through a peripheral wall 11b of this casing so as to retain the overhead console 4.

An edge portion of the wall 11b is formed into an outwardly-directed flange, and this portion serves as a bonding portion 11d for mounting on the top ceiling 3.

A notch 11e for passing the FFC 16 therethrough is formed in the wall 11b, and the FFC 16 is introduced into the casing 11 through the notch 11e, and the distal end of this FFC is electrically connected by welding or press-clamping to a terminal portion 12b formed at the edge portion of the FPC 12.

The configuration of the reverse side of the casing 11 will be described.

As shown in FIG. 3, the reserve sides of the fitting portions 11a and lamp socket portions 14 are shown. When mounting the lamp unit 2 on the vehicle ceiling, this reverse side of the casing is fixed to the vehicle ceiling, and that side of the casing, on which the various electronic parts 15 and the FPC 12 are provided, is the lower side.

The internal structure of the overhead console 4 is as shown at a lower portion of FIG. 3. Ends of the operating switch 21 for operating the switches 13 are exposed to the inner side of the overhead console. The window portions 22 for the lighting of the lamps 17 are disposed on the opposite sides of the operating button 21, respectively. The mounting holes 25 for respectively communicating with the fitting portions 11a (shown in FIG. 2) are formed in the overhead console. Retaining claws 5b for being engaged respectively in the retaining holes 11c are formed on a side wall of the overhead console.

The structure of mounting the FPC 12 on the casing 11 will be described.

As shown in FIG. 4, bosses 11g are formed respectively on predetermined portions of a bottom plate portion 11f of the casing 11. Boss passage holes 12c are formed through the copper foil portion 12b of the FPC 12. For fixing the FPC 12 to the casing 11, the bosses 11g are passed through the boss passage holes 12c, and then distal ends of the bosses 11g are heated to be welded to the FPC.

As shown in FIG. 2, the heating and fusion of the bosses 11g is effected on the plurality of portions of the FPC 12, and therefore when the casing 11 is fixed to the vehicle ceiling, there will not be encountered a disadvantage such that the FPC 12 hangs down. The FPC 12 includes a heat-resistant substrate film composed of polyimide (PI), polyethylene (PEN) or other material.

The structure of the lamp socket portion 14 will be described.

With respect to the structure of the lamp socket portion 14, the FPC 12 is folded to be inserted into a circular fitting portion 11h formed in the bottom plate portion 11f of the casing 11. The parts of the circuit patterns 12a are exposed to an inner surface of this fitting portion 11h, as shown in FIG. 5. With respect to the lamp 17, when its connection portion 17a is fitted into the fitting portion 11h, the lamp 17 is electrically connected to the circuit patterns 12a, and is retained in this fitting portion 11h.

With this construction of the fitting portion 11h, parts of the circuit patterns 12a serve as a connection terminal for energizing the lamp 17, and any connection terminal does not need to be provided, and therefore the number of the component parts can be reduced, and also the time and labor for wiring can be saved.

The cross-sectional structure of the assembly 1 will be described.

The FPC 12 and the FFC 16 are integrally connected together as shown in FIG. 6. Parts of the FPC 12 are folded to be inserted respectively into the fitting portions 11a. Parts of the FPC 12 are connected respectively to the switches 13. The overhead console 4 is held against the lower side of the lamp unit 2, and then when the overhead console 4 is pushed in the direction of arrow A, the retaining claws 5b are retainingly engaged in the retaining holes 11c, respectively, thereby integrally connecting the lamp unit 2 and the overhead console 4 together.

In this condition, when the optional member 26 is pushed through the mounting hole 25 in the direction of arrow B, a retaining claw 26a formed on the side surface of the optional member 26 is retainingly engaged in a retaining hole 11i formed in the fitting portion 11a, and a connection portion 26b of the optional member 26 contacts the circuit pattern of the FPC 12.

The assembly 1 is thus mounted on the vehicle ceiling, and when the operating button 21 is operated, the switches 13 are operated through moving members 23a, so that the lamps 17 are lighted. When the optional member 26 is operated, a control signal is fed from the assembly 1 to the junction box or the like so as to effect a desired operation.

Namely, because of the provision of the optional members 26, the assembly 1 of this embodiment not only serves as the lighting equipment of the room lamp, but also has the control equipments with many functions. As described above, the assembly 1 is connected to the junction box via the FFC 16, and therefore this assembly can be mounted on a door or an instrument panel other than the ceiling, and besides this assembly can be applied to a branch connection from a wire harness.

As described above, in the vehicle ceiling-mounting electric equipment assembly, the flexible printed circuit, having the switch mounted thereon, is fixedly mounted within the casing of the lamp unit, and the flexible flat cable for external connection is connected to one end of the flexible printed circuit, and the casing is fixedly mounted on the ceiling of the vehicle; and the overhead console is retained on the casing, and the switch is operated by operating the operating button.

Therefore, parts, such as a printed circuit board and a connector, and a lamp lead wire circuit do not need to be provided within the lamp unit, and the wire-flattening processing is unnecessary, and fixing members, such as clamps, are not necessary. Therefore, the number of the component parts, as well as the time and labor for the assembling operation, is reduced, and besides the compact design of the electric equipment assembly, as well as the cost reduction, can be achieved.

The bosses, formed on the casing, are passed respectively through the boss passage holes formed in the flexible printed circuit, and the flexible printed circuit is welded to the casing by heating the bosses. Therefore, any screw or the like is not necessary for fixing the flexible printed circuit, and the whole of the vehicle ceiling-mounting electric equipment assembly can be formed into a thin design, and therefore the compact design as well as the lightweight design can be achieved.

The end portion of the flexible printed circuit is folded to be inserted into the fitting portion of a recess-shape formed on the casing, and the circuit pattern of the flexible printed circuit is exposed to the side surface of the fitting portion to form the connection portion for electrical connection to the member fitted into the fitting portion. Therefore, part of the circuit pattern is used as the connection terminal, and the number of the component parts (such as a connection terminal) within the lamp unit can be further reduced.

The flexible printed circuit and the flexible flat cable are connected together by press-claming or welding. Therefore, the more compact, lightweight design of the vehicle ceiling-mounting electric equipment assembly can be achieved, and the transfer in the production process is easy, and the assembly can be handled easily when it is distributed as a product, and this assembly can be provided as a unitary structure or module.

What is claimed is:

1. A vehicle ceiling-mounting electric equipment assembly comprising:
    a lamp unit with a casing fixed to a vehicle ceiling and including a an interior lamp;
    a flexible printed circuit fixed to said casing and provided with a switch for controlling a lighting of said interior lamp;
    a flexible flat cable electrically connected to one end of said flexible printed circuit;
    an over head console retained on said casing and provided with an operation switch which operates said switch.

2. A vehicle ceiling-mounting electric equipment assembly according to claim 1, wherein at least one boss formed on said casing is passed through at least one boss passage hole formed on said flexible printed circuit.

3. A vehicle ceiling-mounting electric equipment assembly according to claim 2, wherein an end of said at least one boss passed through said at least one boss passage hole is welded.

4. A vehicle ceiling-mounting electric equipment assembly according to claim 1, wherein another end of said flexible printed circuit is folded to be inserted into a fitting portion formed on said casing, a circuit pattern of said flexible printed circuit is exposed to a side surface of said fitting portion.

5. A vehicle ceiling-mounting electric equipment assembly according to claim 1, wherein said flexible printed circuit and said flexible flat cable are electrically connected together by press-clamping or welding.

6. A vehicle ceiling-mounting electric equipment assembly according to claim 1, wherein said over head console is retained on said casing so as to position a top ceiling between said over head console and said casing.

7. A vehicle ceiling-mounting electric equipment assembly according to claim 1, wherein a lamp socket hole is formed at said flexible printed circuit so that said interior lamp is passed therethrough.

* * * * *